(12) United States Patent
Watanabe

(10) Patent No.: US 9,903,919 B2
(45) Date of Patent: Feb. 27, 2018

(54) DETERIORATION DETERMINATION DEVICE FOR VEHICLE-DRIVING BATTERY

(71) Applicant: MITSUBISHI JIDOSHA KOGYO KABUSHIKI KAISHA, Tokyo (JP)

(72) Inventor: Kenji Watanabe, Nagoya (JP)

(73) Assignee: MITSUBISHI JIDOSHA KOGYO KABUSHIKI KAISHA, Tokyo (JP)

( * ) Notice: Subject to any disclaimer, the term of this patent is extended or adjusted under 35 U.S.C. 154(b) by 487 days.

(21) Appl. No.: 14/582,748

(22) Filed: Dec. 24, 2014

(65) Prior Publication Data

US 2015/0185290 A1 Jul. 2, 2015

(30) Foreign Application Priority Data

Dec. 26, 2013 (JP) ................................. 2013-268835

(51) Int. Cl.
*G01R 31/36* (2006.01)

(52) U.S. Cl.
CPC ..... *G01R 31/3679* (2013.01); *G01R 31/3606* (2013.01); *G01R 31/3624* (2013.01); *G01R 31/3648* (2013.01)

(58) Field of Classification Search
USPC .......................................................... 702/62
See application file for complete search history.

(56) References Cited

U.S. PATENT DOCUMENTS

| | | | | |
|---|---|---|---|---|
| 5,939,861 A * | 8/1999 | Joko | ........................ | B60K 6/28 290/40 R |
| 2006/0108971 A1* | 5/2006 | Ono | ...................... | H02J 7/1461 320/104 |
| 2006/0176022 A1* | 8/2006 | Namba | ............... | G01R 31/3651 320/130 |
| 2008/0169819 A1* | 7/2008 | Ishii | .................... | G01R 31/3662 324/430 |
| 2008/0204031 A1* | 8/2008 | Iwane | ................ | G01R 31/3624 324/430 |
| 2009/0040033 A1* | 2/2009 | Uchida | ................... | B60K 6/365 340/439 |
| 2009/0051364 A1* | 2/2009 | Ishida | ................... | H02J 7/1461 324/430 |
| 2011/0187329 A1* | 8/2011 | Majima | .................. | G01R 31/36 320/149 |
| 2012/0098489 A1* | 4/2012 | Arai | ...................... | B60L 3/0046 320/109 |

(Continued)

FOREIGN PATENT DOCUMENTS

JP 4172222 B2 10/2008

*Primary Examiner* — Paul D Lee
(74) *Attorney, Agent, or Firm* — Birch, Stewart, Kolasch & Birch, LLP

(57) ABSTRACT

A deterioration determination device for a vehicle-driving battery mounted in a vehicle includes a current detection unit that detects a current value of the battery, a voltage detection unit that detects a voltage value of the battery, and a calculation unit that calculates at predetermined time intervals a resistance value of the battery based on current values detected by the current detection unit and voltage values detected by the voltage detection unit during running of the vehicle, calculates a calculation accuracy of the calculated resistance value, and determines deterioration state of the battery based on the resistance value when the calculation accuracy is higher than a preset calculation accuracy.

6 Claims, 7 Drawing Sheets

(56) References Cited

U.S. PATENT DOCUMENTS

2013/0013238 A1* 1/2013 Kawakita ............... H02J 7/044
  702/63
2013/0080096 A1* 3/2013 Toki ................... G01R 31/3624
  702/63

* cited by examiner

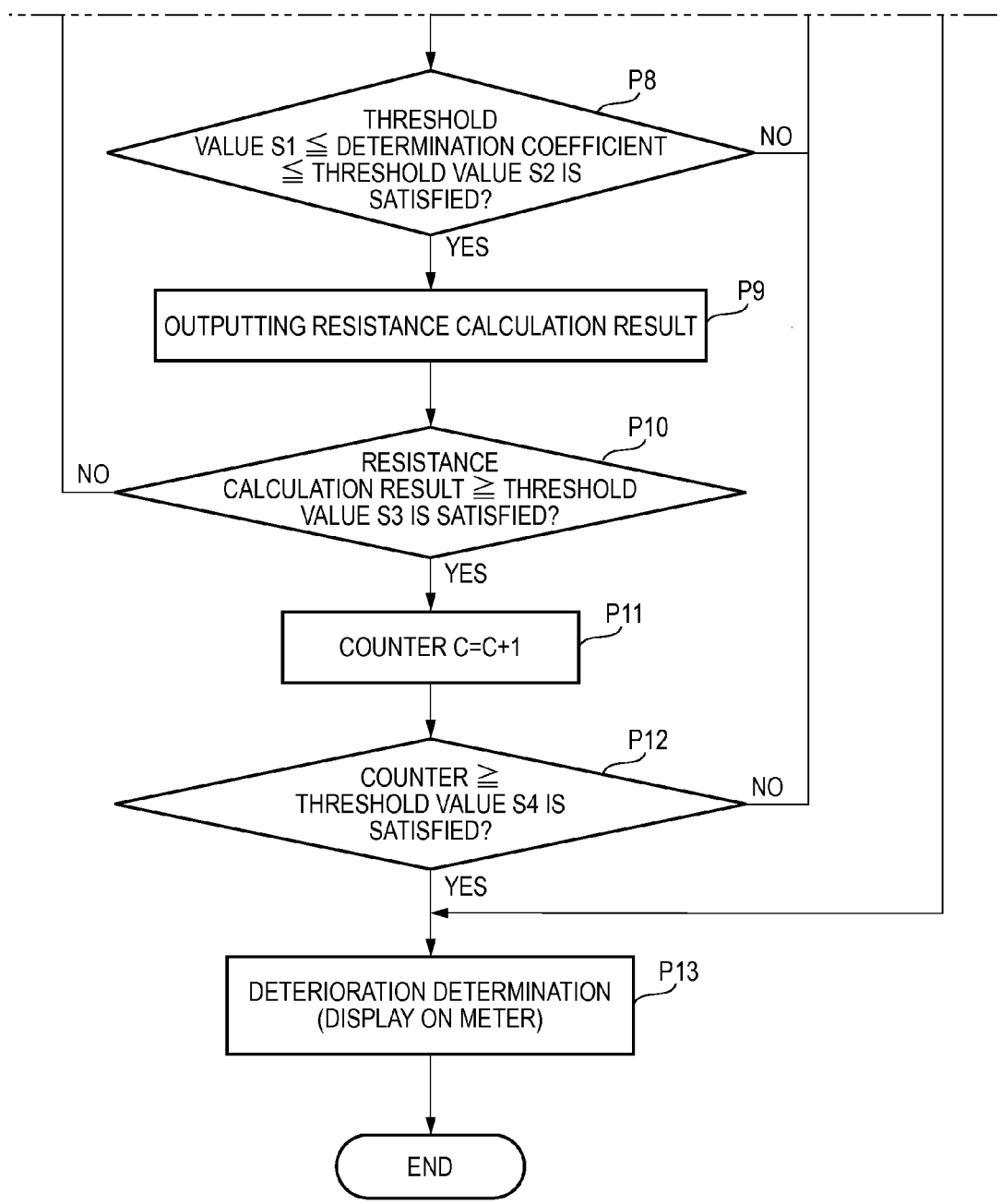
(Fig. 2 Continued)

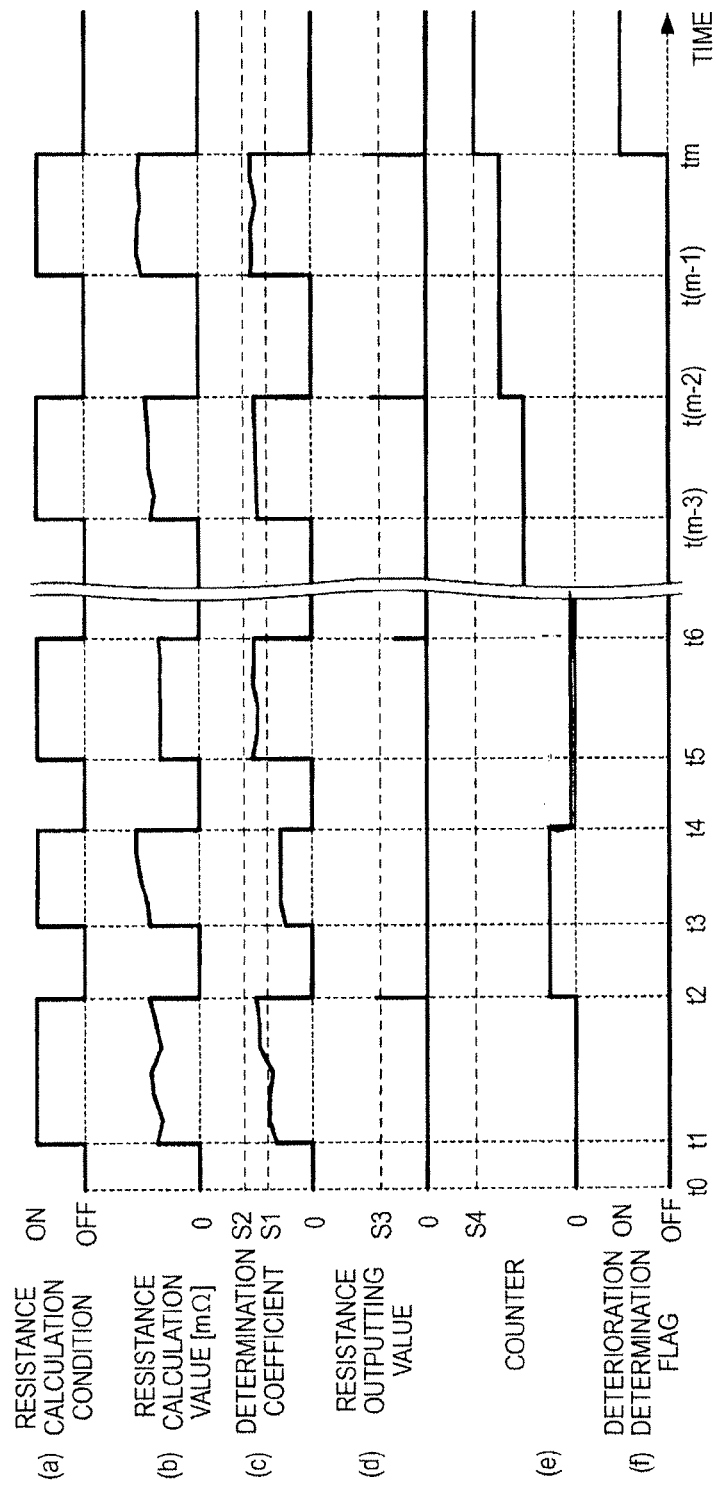

DETERIORATION DETERMINATION DEVICE FOR VEHICLE-DRIVING BATTERY

CROSS REFERENCE TO RELATED APPLICATION

This application is based on Japanese Patent Application No. 2013-268835 filed on Dec. 26, 2013, the contents of which are incorporated herein by reference.

BACKGROUND

1. Technical Field

The present invention relates to a deterioration determination device for a vehicle-driving battery, and in particular, to technology of performing deterioration determination of the driving battery during running of a vehicle.

2. Related Art

Conventionally, for a vehicle which has a driving battery mounted therein and is adapted to be run by a motor, a method for determining a degree of deterioration (hereinafter, referred to as deterioration state) of the driving battery by calculating a resistance of the driving battery while the driving battery is charged by an external power supply has been established.

In this case, if the vehicle is an electric vehicle in where is run by driving the motor by an electric power supplied from the driving battery, charging must be performed by the external power supply, and therefore deterioration state of the driving battery can be determined by calculating a resistance of the driving battery during charging. However, in a case of a vehicle, such as PHEV, in which an engine and a driving battery are mounted therein and the driving battery can be charged by a regenerative brake during running, users could exist who charge the driving battery by power generation through driving of the engine and by the regenerative brake during running and hardly use charging by the external power supply. Therefore, when deterioration state of the driving battery is determined during charging by the external power supply, there is a possibility that depending upon use situations of the driving battery, a chance of calculating a resistance of the driving battery does not exist and thus it is difficult to grasp an exact deterioration state of the driving battery.

On the other hand, in the following Patent Document 1, a technique is known in which when input/output demands of an electric power to a driving battery based on operation state of a vehicle during running of the vehicle have preset input/output patterns, deterioration degree of the driving battery for each input/output pattern is diagnosed.

[Patent Document 1] Japanese Patent No. 4172222

However, unlike during charging by the external power supply, current values and voltage values detected during running are unstable, i.e., can be varied depending upon running state. Therefore, a resistance value of the driving battery calculated based on the current values and the voltage values detected during running is also likely to be varied. In addition, if variations in the resistance value are occurred, there is a risk that deterioration state of the driving battery cannot be exactly grasped and thus deterioration state of the driving battery can be erroneously determined.

To this end, an object of the present invention is to provide a deterioration determination device for a vehicle-driving battery, which makes it possible to grasp deterioration state of the driving battery at a high accuracy even during running.

SUMMARY OF THE INVENTION (1) In order to solve the above matter, a deterioration determination device for a vehicle-driving battery mounted in a vehicle includes:
a current detection unit that detects a current value of the battery;
a voltage detection unit that detects a voltage value of the battery; and
a calculation unit that calculates at predetermined time intervals a resistance value of the battery based on current values detected by the current detection unit and voltage values detected by the voltage detection unit during running of the vehicle, calculates a calculation accuracy of the calculated resistance value, and determines deterioration state of the battery based on the resistance value when the calculation accuracy is higher than a preset calculation accuracy.

(2) In the deterioration determination device for the vehicle-driving battery according to (1), the calculation unit is configured to acquire at predetermined time intervals plotted data of the current values and the voltage values based on the current values detected by the current detection unit and the voltage values detected by the voltage detection unit during running of the vehicle, to determine the calculation accuracy of the resistance value based on the acquired plotted data, and to determine deterioration state of the battery based on the resistance value when a degree of variations in the plotted data falls in a determination threshold value range.

(3) The deterioration determination device for the vehicle-driving battery according to (1) or (2) further includes a vehicle operation state detection unit that detects operation state of the vehicle and the calculation unit performs calculation of the resistance value of the battery when a preset resistance calculation condition based on the operation state of the vehicle is satisfied.

(4) In the deterioration determination device for the vehicle-driving battery according to (3), the resistance calculation condition is determined to be satisfied when the operation state of the vehicle is a decelerating state, a starting state or an accelerating state.

(5) In the deterioration determination device for the vehicle-driving battery according to (4), the resistance calculation condition is additionally determined to be satisfied when the current values detected by the current detection unit fall in a preset range.

(6) In the deterioration determination device for the vehicle-driving battery according to any one of (1) to (5), the calculation unit includes a counter and is configured to add 1 to a value of the counter when a calculation result of the resistance value is equal to or larger than a preset deterioration determination threshold value, to reset the counter when the calculation result of the resistance value is smaller than the deterioration determination threshold value, and to perform deterioration determination when the value of the counter is equal to or larger than a preset warning threshold value.

(7) The deterioration determination device for the vehicle-driving battery according to (6), further includes a temperature detection unit that detects a temperature of the battery and the deterioration determination threshold value is chosen depending upon the temperature of the battery.

(8) The deterioration determination device for the vehicle-driving battery according to any one of (1) to (7) further includes a display for displaying deterioration state of the driving-battery determined by the calculation unit.

According to the deterioration determination device for the vehicle-driving battery of the preset invention as described above, deterioration state of a driving battery can be grasped at a high accuracy even during running of a vehicle, thereby providing an exact deterioration determination.

BRIEF DESCRIPTION OF THE DRAWINGS

FIG. 3 is an explanatory view showing, in time series, the deterioration determining process in the deterioration determination device for the vehicle-driving battery according to the embodiment of the invention.

DESCRIPTION OF PREFERRED EMBODIMENT

Details of a deterioration determination device and deterioration determination unit for a vehicle-driving battery according to the present invention will be now described with reference to the accompanying drawings.

Illustrative Embodiment

A deterioration determination device for a vehicle-driving battery according to one embodiment of the present invention will be described with reference to FIGS. 1 to 8.

Figure 1:
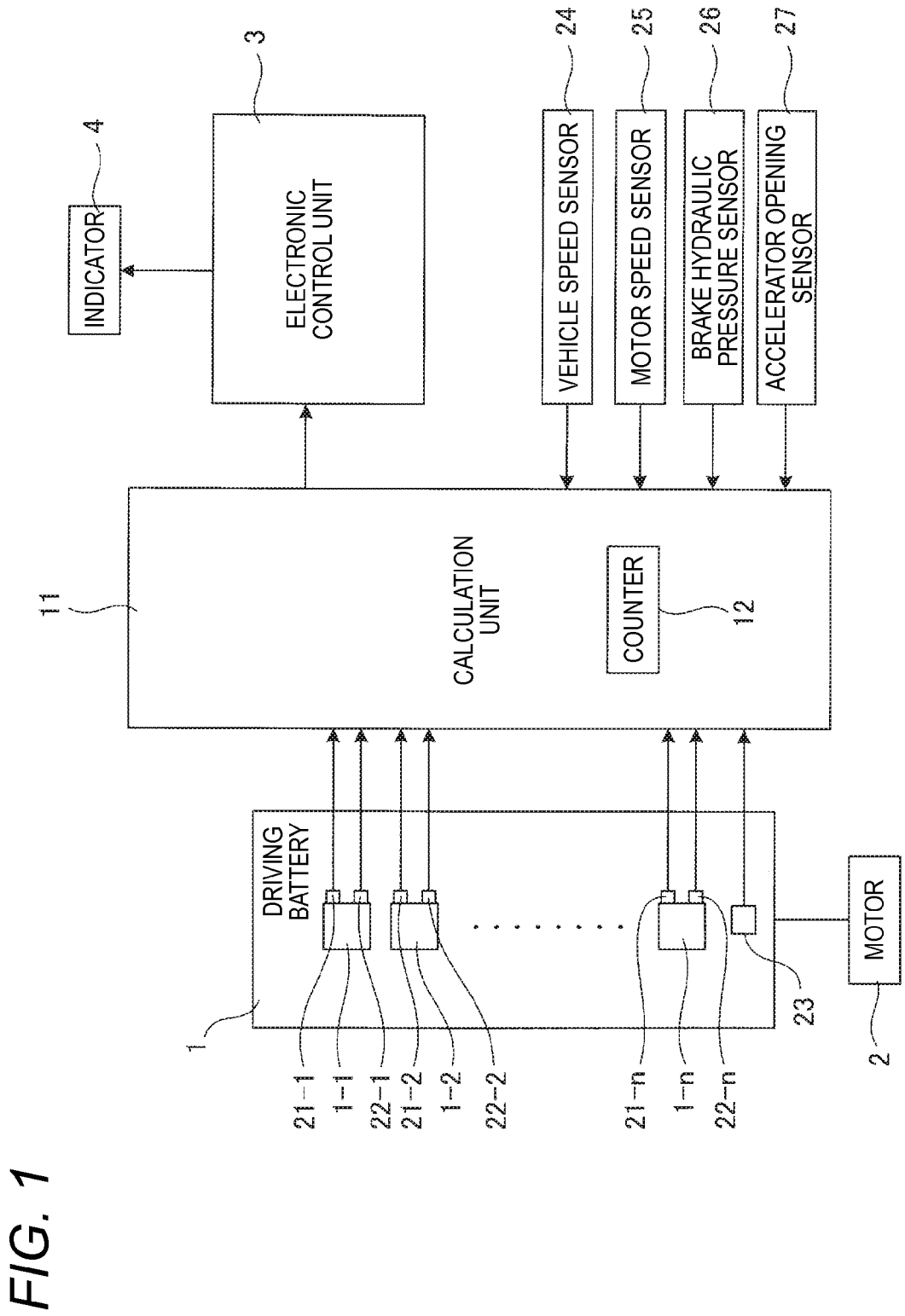
FIG. 1 is a simplified block diagram showing a schematic configuration of a deterioration determination device for a vehicle-driving battery according to one embodiment of the present invention.

As shown in FIG. 1, according to the present embodiment, a vehicle has at least a battery for driving thereof (hereinafter, referred to as an 'driving battery') 1, a motor 2, an electronic control unit 3, and an indicator 4 as a display unit, and additionally has a calculation unit 11 as a calculation unit.

The driving battery 1 is constituted of a plurality of battery cells 1-1, 1-2, . . . , 1-n (hereinafter, referred to as 'battery cells 1-j' ((j=1, 2, . . . , n)) electrically connected to each other. Meanwhile, although not shown, the battery cells 1-j are grouped in plural numbers to constitute battery modulus, and also the battery modules are combined to form the driving battery 1.

The battery cells 1-j are respectively provided with voltage sensors 21-1, 21-2, . . . , 21-n (hereinafter, referred to as 'voltage sensors 21-j' (j=1, 2, . . . , n)) as voltage detection unit and temperature sensors 22-1, 22-2, . . . , 22-n (hereinafter, referred to as 'temperature sensors 22-j' (j=1, 2, . . . , n)) as temperature detection unit. A voltage value and a temperature of each of the battery cells 1-j detected by the voltage sensors 21-j and the temperature sensors 22-j are inputted to the calculation unit 11.

Also, a current sensor 23 as a current detection unit is provided between the driving battery 1 and the motor 2. A current value detected by the current sensor 23 is inputted to the calculation unit 11.

During starting, acceleration or the like of the vehicle, the motor 2 is driven by an electric power supplied from the driving battery 1 to rotate a rotation shaft, not shown, of the vehicle, but in a state where an electric power from the driving battery 1 is not supplied thereto, such as during deceleration of the vehicle, performs power generation by regenerative energy (i.e., operates a generator, not shown, by driving of a regenerative brake and an engine) to charge the driving battery 1. Meanwhile, FIG. 1 shows exchanging of an electric power between the driving battery 1 and the motor 2 with some members omitted for the sake of clarity thereof.

The electronic control unit 3 is a unit for electronically controlling the entire vehicle and in the present embodiment, in addition to normal controls, performs a control of outputting an instruction to the indicator 4 for causing the indicator 4 to indicate a warning when deterioration determination as described below is performed in the calculation unit 11.

The indicator 4 is a means for warning deterioration determination of the driving battery 1 based on the instruction inputted from the electronic control unit 3 thereto, and for example, performs such a warning by meter display.

The calculation unit 11, which has a counter 12, determines deterioration of the driving battery 1 based on the voltage values detected by the voltage sensors 21-j, the temperatures detected by the temperature sensors 22-j and the current value detected by the current sensor 23, and additionally on a rotation speed of the motor detected by a motor speed sensor 25 as a vehicle operation state detection unit and then outputs a determination result.

Alternatively, as the vehicle operation state detection unit, a vehicle speed sensor 24, a brake hydraulic pressure sensor 26 or an accelerator opening sensor 27 may be employed instead of the motor speed sensor 25, and also any combination of a plurality of sensors of the vehicle speed sensor 24, the motor speed sensor 25, the brake hydraulic pressure sensor 26 and the accelerator opening sensor 27 may be employed.

Next, a process for determining deterioration of the vehicle-driving battery by the calculation unit 11 will be described in detail with reference to FIGS. 2 to 8.

Figure 2:
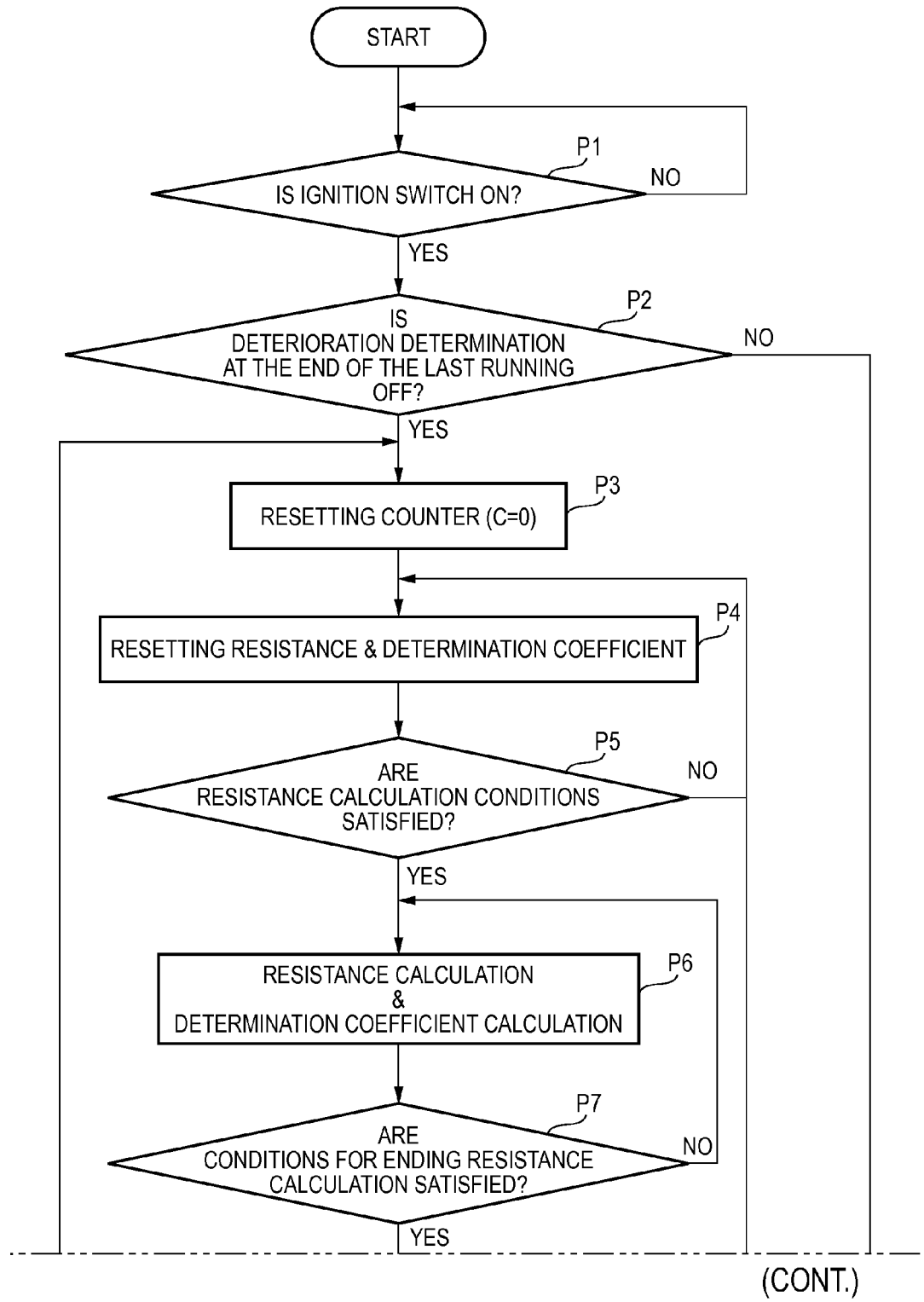
FIG. 2 is a flow chart showing flow of a deterioration determining process in the deterioration determination device for the vehicle-driving battery according to the embodiment of the invention.

As shown in FIG. 2, the calculation unit 11 firstly determines whether an ignition switch is on or not (step P1). If the ignition switch in the step P1 is on (YES), whether deterioration determination at the end of the last running is OFF or not is determined (step P2). Meanwhile, if the ignition switch in the step P1 is off (NO), the process returns to the step P1.

If deterioration determination at the end of the last running in the step P2 is OFF (YES), then the counter is reset as at a time t0 shown in an item (e) of FIG. 3, i.e., to cause a value C of the counter to become C=0 (step P3). Contrarily, if deterioration determination at the end of the last running in the step P2 is ON (NO), then the process proceeds to a step P13 as described below.

Subsequently to the step P3, a resistance calculation value and a determination coefficient are respectively reset to become zero as shown at a time t0 in items (b) and (c) of FIG. 3 (step P4).

Next, whether conditions for initiating resistance calculation are satisfied or not is determined (step P5). Specifically, the conditions for initiating resistance calculation are considered to be satisfied if preset resistance calculation conditions (in the present embodiment, the vehicle should be in a state where the vehicle is being decelerated during running, started from a stop state, or accelerated during running, and also the current value detected by the current sensor 23 should fall in a preset range) are satisfied. In other words, according to the embodiment, whether the condition for initiating resistance calculation is satisfied or not is determined based on the detected values inputted from the current sensor 23 and the motor speed sensor 25.

Figure 4A:
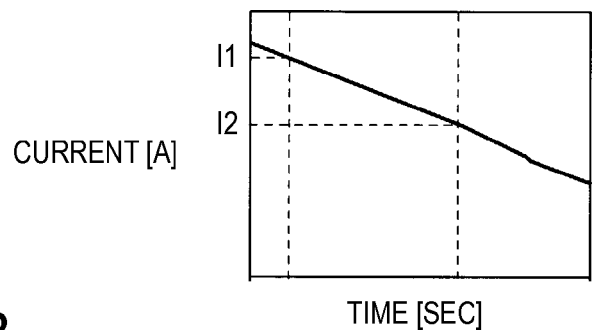
FIGS. 4A and 4B are graphs showing examples of changes in an electric current value and a voltage value during deceleration of a vehicle.
Figure 5A:
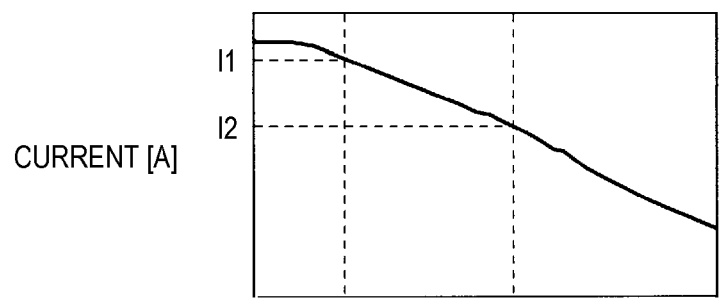
FIGS. 5A and 5B are graphs showing examples of changes in an electric current value and a voltage value during starting or acceleration of a vehicle.
Figure 5B:
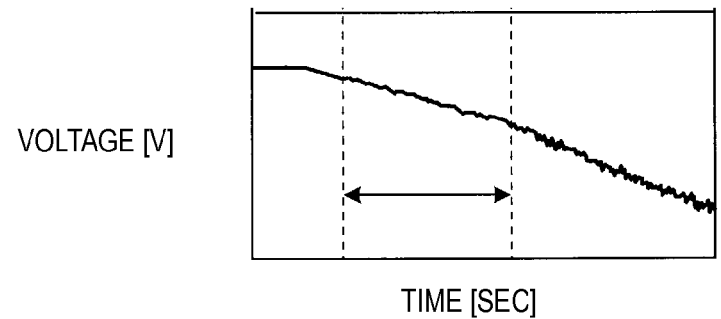

For example, according to the present embodiment, when in a state where the vehicle is being decelerated during running, started from a stop state or accelerated during running, the current value detected by the current sensor 23 falls in a range of I1 or more and I2 or less shown in FIGS. 4A and 5A, it is determined that the resistance calculation conditions are stratified, i.e., the conditions for initiating resistance calculation are satisfied, but in other cases, it is determined that the conditions for initiating resistance calculation are not satisfied.

In the step P5, if the conditions for initiating resistance calculation are not satisfied (NO), resistance calculation conditions are turned off, for example, as in t0 to t1, t2 to t3, t4 to t5 and the like shown in an item (a) of FIG. 3, and then the process returns to the step P4.

On the other hand, in the step P5, if the conditions for initiating resistance calculation are satisfied (YES), resistance calculation conditions are turned on, for example, as in t1 to t2, t3 to t4, t5 to t6 and the like shown in an item (a) of FIG. 3, and the resistance value of the battery cells 1-$j$ and the determination coefficient thereof are calculated (step P6).

If the resistance value of the battery cells 1-$j$ and the determination coefficient thereof have been calculated in the step P6, then whether conditions for ending resistance calculation are satisfied or not is determined (step P7). The conditions for ending resistance calculation is contrary to the conditions for initiating resistance calculation as described above, and thus it is determined that when the conditions for initiating resistance calculation are not satisfied, the conditions for ending resistance calculation are satisfied.

In the step P7, if the conditions for ending resistance calculation are not satisfied (NO), the process returns to the step P6.

Namely, as shown in items (a) to (c) of FIG. 3, while the resistance calculation conditions are on, the resistance value of the battery cells 1-$j$ and the determination coefficient thereof are repeatedly calculated at predetermined time intervals.

Figure 4B:
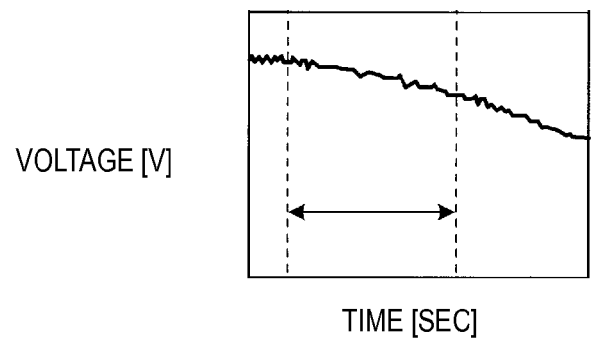

In this case, when the vehicle is being decelerated during running, the voltage values of the battery cells 1-$j$ detected by the voltage sensors 21-$j$ and the current value of the battery cells 1-$j$ detected by the current sensor 23 are respectively varied as shown as one example in FIGS. 4A and 4B. Also, when the vehicle is being started from a stop state or accelerated during running, the voltage values of the battery cells 1-$j$ detected by the voltage sensors 21-$j$ and the current value of the battery cells 1-$j$ detected by the current sensor 23 are respectively varied as shown as one example in FIGS. 5A and 5B.

Figure 6:
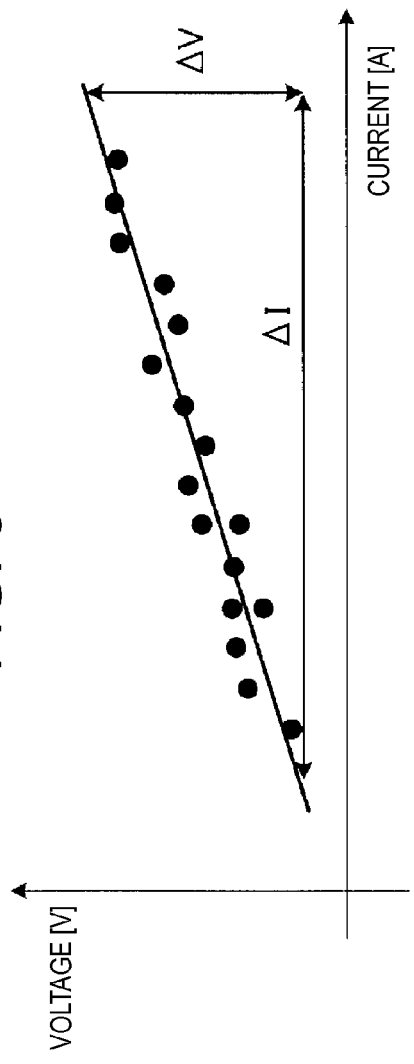
FIG. 6 is an explanatory view showing a method of calculating a resistance calculation value in the deterioration determination device for the vehicle-driving battery according to the embodiment of the invention.

In this case, when as shown in FIG. 6, an x-axis represents a current I and a y-axis represents a voltage V, and the current I and the voltage V have a relationship as shown as a solid line in FIG. 6, a resistance R is obtained by the following equation (1) according to Ohm's law.

$$R = \Delta V / \Delta I \quad (1)$$

However, actually, when the detected values from the voltage sensors 21-$j$ and the current sensor 23 are acquired at predetermined time intervals while the resistance calculation conditions are on and then such acquired data are plotted, some degree of variation is occurred as shown as dots in FIG. 6, even if the data are acquired from one battery cell 1-$j$. Therefore, in the present embodiment, a gradient of the straight line shown in FIG. 6 is calculated using an approximation equation (least-squares method) represented in the following equation (2) and then is employed as the resistance calculation value a of the battery cells 1-$j$.

[Formula 1]

$$a = \frac{k \Sigma x_i y_i - \Sigma x_i \Sigma y_i}{k \Sigma x_i^2 - (\Sigma x_i)^2} \quad (2)$$

where x is a current, y is a voltage, k is the number of times that the resistance calculation value is calculated, and i is 1, 2, ..., k.

Also, the determination coefficient $r^2$ is a barometer representing a calculation accuracy (e.g., a relationship between the slide line and the dots shown in FIG. 6) of the resistance calculation value a (the gradient of the straight line) of the battery cells 1-$j$ obtained by the above equation (2), and is calculated by the following equation (3).

[Formula 2]

$$r^2 = \left\{ \frac{\Sigma(x_i - \bar{x})(y_i - \bar{y})}{\sqrt{\Sigma(x_i - \bar{x})^2 \Sigma(y_i - \bar{y})^2}} \right\}^2 \quad (3)$$

where $\bar{x}$, $\bar{y}$ are respectively average values of currents and voltages.

Figure 7C:
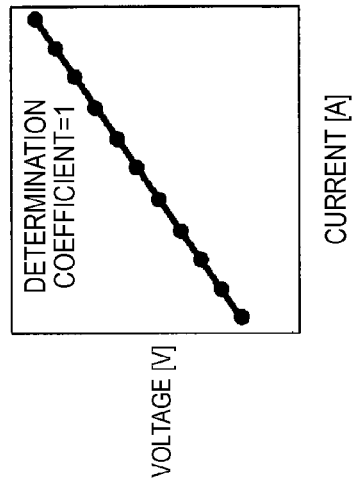
FIGS. 7A to 7C are explanatory views showing a relationship between a calculation accuracy of a calculated resistance calculation value and a determination coefficient in the deterioration determination device for the vehicle-driving battery according to the embodiment of the invention.
Figure 7B:
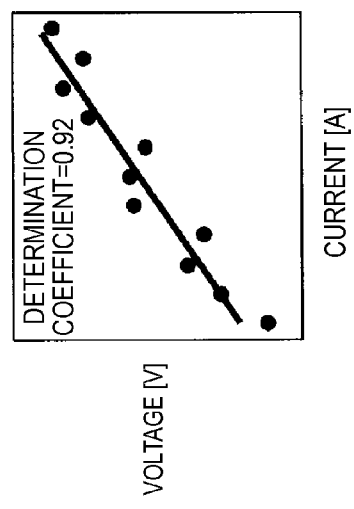
Figure 7A:
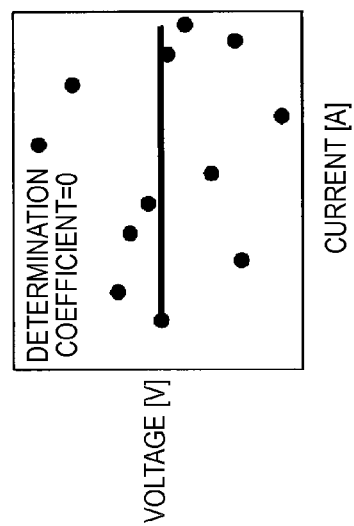
Figure 8:
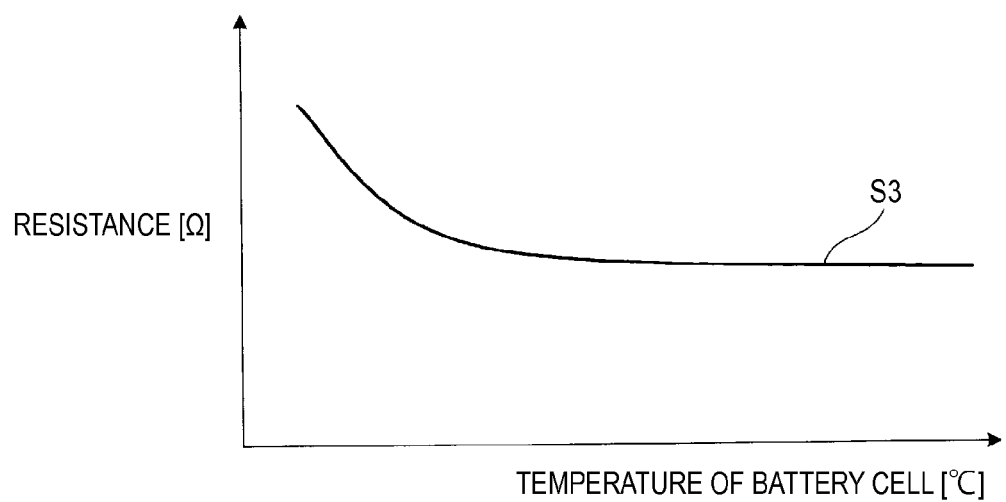
FIG. 8 is an explanatory showing a relationship between a deterioration determination threshold value and a temperature of battery cells in the deterioration determination device for the vehicle-driving battery according to the embodiment of the invention.

As seen from the above equation (3), the determination coefficient $r^2$ has a value falling between 0 and 1. More specifically, when the plotted data has large variations as shown in FIG. 7A, the determination coefficient $r^2$ has a value near to 0, whereas as shown in FIGS. 7B and 7C, the smaller the variations in the plotted data, the nearer the determination coefficient $r^2$ is to 1. In this way, according to the present embodiment, the calculation accuracy of the resistance calculation value a is determined by obtaining the determination coefficient $r^2$ from the plotted data of the voltage values of the battery cells 1-$j$ detected by the voltage sensors 21-$j$ and the current values detected by the current sensor 23, which are acquired at predetermined time intervals while the resistance calculation conditions are on.

On the other hand, if the conditions for ending resistance calculation are satisfied (YES) in the step P7, whether or not the determination coefficient $r^2$ is equal to or larger than a determination threshold value S1 for the calculation accuracy and also equal to or smaller than a determination threshold value S2 for the calculation accuracy is determined (step P8). In the step P8, if the determination coefficient $r^2$ is smaller than the determination threshold value S1 for the calculation accuracy or larger than the determination threshold value S2 for the calculation accuracy (NO), the process returns to the step P4. Contrarily, in the step 8, if the determination coefficient $r^2$ is equal to or larger than the determination threshold value S1 for the calculation accuracy and also equal to or smaller than the determination threshold value S2 for the calculation accuracy (YES), then a result of calculating the resistance calculation value a (resistance calculation result) is outputted as a resistance output value (step P9). Meanwhile, according to the present embodiment, if a case where the determination coefficient $r^2$ is equal to or larger than the determination threshold value S1 for the calculation accuracy and also equal to or smaller than the determination threshold value S2 for the calculation accuracy while the resistance calculation conditions are turned on is present at least one time in the processing of the step P8, the process proceeds to the step P9 to output the resistance calculation result. That is, when the determination coefficient $r^2$ is equal to or larger than the determination threshold value S1 and equal to or smaller than the determination threshold value S2, it is determined that the calculation accuracy of the resistance calculation result a is equal to or higher than a predetermined calculation accuracy and a result of the resistance calculation is output. On the other hand, when the determination coefficient $r^2$ is smaller than the determination threshold value S1 or larger than the determination threshold value S2, it is determined that the calculation accuracy of the resistance calculation result a is lower than the predetermined calculation accuracy and the result of the resistance calculation is not output. For example, the determination threshold value S1 may be set to 0.95 and the determination threshold value S2 may be set to 1, but the determination threshold values S1 and S2 shall not be necessarily limited to the above numerals. The determination threshold values may be set based on a test result. The calculation accuracy gets higher as the determination coefficient $r^2$ becomes closer to 1.

Subsequently to the step P9, whether or not the resistance calculation result is equal to or larger than a deterioration determination threshold value S3 is determined (step P10). In this case, because the resistance value of the battery cells 1-$j$ are varied depending upon a temperature, according to the present embodiment, the deterioration determination threshold value S3 is chosen depending upon a temperature of the battery cells 1-$j$ as show in FIG. 8.

In the step P10, if the resistance calculation result is smaller than the deterioration determination threshold value S3 (NO), the process returns to the step P3. Contrarily, in the step P10, if the resistance calculation result is equal to or larger than the deterioration determination threshold value S3 (YES), 1 is added to the value C of the counter, thereby causing C=C+1 (step P11).

Subsequently to the step P11, whether or not the value C of the counter is equal to or larger than a warning threshold value S4 is determined (step P12). In the step P12, if the value C of the counter is smaller than the warning threshold value S4 (NO), the process returns to the step P4. Contrarily, in the step P12, if the value C of the counter is equal to or larger than the warning threshold value S4 (YES), it is determined that the driving battery 1 has been deteriorated, and thus an instruction for causing the indicate 4 to indicate a warning is outputted to the electronic control unit 3 (step P13).

In the above manner, deterioration determination of the driving battery 1 (battery cells 1-$j$) is performed.

The above process will be described in detail with reference to FIG. 3. According to the deterioration determination device for the vehicle-driving battery of the present embodiment, the resistance calculation conditions are on during a period from a time t1 to a time t2 as shown in the item (a) of FIG. 3 and therefore the resistance calculation value a of the battery cells 1-$j$ and the determination coefficient $r^2$ thereof are repeatedly calculated at predetermined time intervals as shown in the items (b) and (c) of FIG. 3. During this period, because the determination coefficient $r^2$ is equal to or larger than the determination threshold value S1 for the calculation accuracy and also equal to or smaller than the determination threshold value S2 for the calculation accuracy, the resistance calculation value a of the battery cells 1-$j$ is outputted at the time t2, as shown in the item (d) of FIG. 3, at which the conditions for ending resistance calculation are satisfied. Also, because the resistance calculation value a of the battery cells 1-$j$ is equal to or larger than the deterioration determination threshold value S3, 1 is added to the value C of the counter as shown in the item (e) of FIG. 3, and then the resistance calculation value a and the determination coefficient $r^2$ thereof are reset as shown in the items (b) and (c) of FIG. 3.

Also, during a period from a time t3 to a time t4 shown in FIG. 3, the resistance calculation conditions are on as shown in the item (a) of FIG. 3, and therefore the resistance calculation value a of the battery cells 1-$j$ and the determination coefficient $r^2$ thereof are repeatedly calculated as shown in the items (b) and (c) of FIG. 3. However, during this period, because the determination coefficient $r^2$ is smaller than the determination threshold value S1 for the calculation accuracy, as shown in the item (c) of FIG. 3, the resistance calculation value a of the battery cells 1-$j$ is not outputted at the time t4, at which the conditions for ending resistance calculation are satisfied. Thus, the value C of the counter is reset as shown in the item (e) of FIG. 3, and also the resistance calculation value a and the determination coefficient $r^2$ thereof are reset as shown in the items (b) and (c) of FIG. 3.

In addition, during a period from a time t5 to a time t6 shown in FIG. 3, the resistance calculation conditions are on as shown in the item (a) of FIG. 3, and therefore the resistance calculation value a of the battery cells 1-$j$ and the determination coefficient $r^2$ thereof are repeatedly calculated as shown in the items (b) and (c) of FIG. 3. During this period, because the determination coefficient $r^2$ is equal to or larger than the determination threshold value S1 for the calculation accuracy and also equal to or smaller than the determination threshold value S2 for the calculation accuracy, as shown in the item (d) of FIG. 3, the resistance calculation value a of the battery cells 1-$j$ is outputted at the time t6, at which the conditions for ending resistance calculation are satisfied. However, because the resistance calculation value a of the battery cells 1-$j$ is smaller than the deterioration determination threshold value S3, the value C of the counter is reset as shown in the item (e) of FIG. 3, and also the resistance calculation value a and the determination coefficient $r^2$ thereof are reset as shown in the items (b) and (c) of FIG. 3

The process as described above is repeated and thus if the value C of the counter is equal to or larger than the warning threshold value S4 as at a time tm shown in FIG. 3, a deterioration determination flag is on as shown in the item (f) of FIG. 3 and as a result, a warning is indicated on the indicator 4.

In this case, according to the present embodiment, the resistance calculation value a and the determination coefficient $r^2$ thereof are calculated for each of the battery cells 1-*j*. As in the embodiment, when the resistance calculation value a and the determination coefficient $r^2$ thereof are calculated for each of the battery cells 1-*j*, deterioration determination can be performed for each of the battery cells 1-*j* as an unit. But, calculation of the resistance calculation value a and the determination coefficient $r^2$ are not limited to the above embodiment, and accordingly, instead of calculating the resistance calculation value a and the determination coefficient $r^2$ for each of the battery cells 1-*j*, the resistance calculation value a and the determination coefficient $r^2$ may be calculated for each battery unit, such as a battery module.

Also, although in the present embodiment an example has been described in which upper and lower limits in the range of current values satisfying the resistance calculation conditions are respectively set to I1 and I2, the range of current values is set for the purpose of enhancing the calculation accuracy of the resistance value calculated, and therefore upper and lower limits in the range of current values may have any values other than I1 and I2.

In addition, although in the present embodiment, the resistance calculation conditions are set that the vehicle should be in a state where the vehicle is being decelerated during running, started from a stop state, or accelerated during running, and also the current value detected by the current sensor 23 should fall in a preset range, the resistance calculation conditions are not limited to the above embodiment, and accordingly, it may be sufficient at least if the vehicle is in a state where the vehicle is being decelerated during running, started from a stop state, or accelerated during running.

According to the deterioration determination device for the vehicle-driving battery of the present embodiment configured as described above, even during running, in which variations in a voltage value and a current value are likely to be occurred, the resistance calculation value a of each of the battery cells 1-*j* can be calculated at a high accuracy, and thus a deterioration state of the entire driving battery 1 or each of the battery cells 1-*j* can be exactly grasped so that deterioration determination thereof can be performed at a high accuracy.

Also, when current values in a preset range included in the resistance calculation conditions are used for calculating the resistance value and also the range of current values are preset to be a range in which current values are stably obtained when the vehicle is being decelerated during running, started from a stop state, or accelerated during running, as compared to a case where the range of current values is not used, a calculation accuracy of the resistance value calculated using such current values can be enhanced to allow deterioration determination of the battery to have a good efficiency.

The present invention is suitable to be applied to a deterioration determination device for a vehicle-driving battery, which is adapted to determine deterioration of the driving battery during running.

What is claimed is:

1. A deterioration determination device for a vehicle-driving battery mounted in a vehicle comprising:
    a current detection unit that detects a current value of the battery;
    a voltage detection unit that detects a voltage value of the battery;
    a calculation unit that calculates at predetermined time intervals a resistance value of the battery based on current values detected by the current detection unit and voltage values detected by the voltage detection unit during running of the vehicle, calculates a calculation accuracy of the calculated resistance value, and determines deterioration state of the battery based on the resistance value when the calculation accuracy is higher than a preset calculation accuracy; and
    a display that displays the determined deterioration state to allow a driver of the vehicle to grasp the deterioration state of the battery during running of the vehicle,
    wherein the calculation unit includes a counter and is configured to add 1 to a value of the counter when a calculation result of the resistance value is equal to or larger than a preset deterioration determination threshold value, to reset the counter when the calculation result of the resistance value is smaller than the deterioration determination threshold value, and to perform deterioration determination when the value of the counter is equal to or larger than a preset warning threshold value,
    wherein the battery is replaced based on the determined deterioration state.

2. The deterioration determination device for the vehicle-driving battery according to claim 1, wherein the calculation unit is configured to acquire at predetermined time intervals plotted date of the current values and the voltage values based on the current values detected by the current detection unit and the voltage values detected by the voltage detection unit during running of the vehicle, to determine the calculation accuracy of the resistance value based on the acquired plotted date, and to determine deterioration state of the battery based on the resistance value when a degree of variations in the plotted date falls in a determination threshold value range.

3. The deterioration determination device for the vehicle-driving battery according to claim 1, further comprising:
    a vehicle operation state detection unit that detects operation state of the vehicle;
    wherein the calculation unit performs calculation of the resistance value of the battery when a preset resistance calculation condition based on the operation state of the vehicle is satisfied.

4. The deterioration determination device for the vehicle-driving battery according to claim 3, wherein the resistance calculation condition is determined to be satisfied when the operation state of the vehicle is a decelerating state, a starting state or an accelerating state.

5. The deterioration determination device for the vehicle-driving battery according to claim 4, wherein the resistance calculation condition is additionally determined to be satisfied when the current values detected by the current detection unit fall in a preset range.

6. The deterioration determination device for the vehicle-driving battery according to claim 1, further comprising:
    a temperature detection unit that detects a temperature of the battery,
    wherein the deterioration determination threshold value is chosen depending upon the temperature of the battery.

\* \* \* \* \*